(12) United States Patent
Ho et al.

(10) Patent No.: US 9,633,935 B2
(45) Date of Patent: Apr. 25, 2017

(54) STACKED CHIP PACKAGE INCLUDING SUBSTRATE WITH RECESS ADJOINING SIDE EDGE OF SUBSTRATE AND METHOD FOR FORMING THE SAME

(71) Applicant: XINTEC INC., Taoyuan (TW)

(72) Inventors: Yen-Shih Ho, Kaohsiung (TW);
Chih-Wei Ho, Taoyuan (TW);
Tsang-Yu Liu, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/697,235

(22) Filed: Apr. 27, 2015

(65) Prior Publication Data

US 2015/0311175 A1 Oct. 29, 2015

(30) Foreign Application Priority Data

Apr. 28, 2014 (TW) .............................. 103115137 A

(51) Int. Cl.
*H01L 23/00* (2006.01)
*H01L 25/065* (2006.01)
(Continued)

(52) U.S. Cl.
CPC ........ *H01L 23/49811* (2013.01); *B81B 7/007* (2013.01); *H01L 21/78* (2013.01); *H01L 24/02* (2013.01); *H01L 24/05* (2013.01); *H01L 24/06* (2013.01); *H01L 24/48* (2013.01); *H01L 25/0657* (2013.01); *B81B 2207/093* (2013.01);
(Continued)

(58) Field of Classification Search
CPC ..... H01L 24/49; H01L 25/50; H01L 25/0657;
H01L 24/02; H01L 23/49838; H01L 24/43; H01L 24/85; H01L 23/49811;
H01L 2224/0231; H01L 2224/0235;
H01L 2224/02375; H01L 2224/02373;
H01L 2225/06506; H01L 2225/0651;
H01L 2225/06555
USPC ....... 257/777, 685, 686, 723, 724, 727, 728, 257/778, 784, 786
See application file for complete search history.

(56) References Cited

U.S. PATENT DOCUMENTS

| | | | |
|---|---|---|---|
| 7,199,345 B1 * | 4/2007 | Meisel .................... | H01J 29/98 250/207 |
| 8,206,999 B2 * | 6/2012 | Matsuda ............... | H01L 33/486 257/E33.059 |

(Continued)

FOREIGN PATENT DOCUMENTS

| TW | 201216384 | 4/2012 |
|---|---|---|
| TW | 201246488 | 11/2012 |
| TW | 201351608 | 12/2013 |

*Primary Examiner* — Alexander Oscar Williams
(74) *Attorney, Agent, or Firm* — Liu & Liu

(57) ABSTRACT

A stacked chip package is provided. The stacked chip package includes a first substrate having a first side and a second side opposite thereto. The first substrate includes a recess therein. The recess adjoins a side edge of the first substrate. A plurality of redistribution layers is disposed on the first substrate and extends onto the bottom of the recess. A second substrate is disposed on the first side of the first substrate. A plurality of bonding wires is correspondingly disposed on the redistribution layers in the recess, and extends onto the second substrate. A device substrate is disposed on the second side of the first substrate. A method of forming the stacked chip package is also provided.

24 Claims, 11 Drawing Sheets

(51) Int. Cl.
*H01L 23/498* (2006.01)
*H01L 25/00* (2006.01)
*H01L 21/78* (2006.01)
*B81B 7/00* (2006.01)
*H01L 21/683* (2006.01)
*H01L 29/06* (2006.01)
*H01L 23/13* (2006.01)

(52) U.S. Cl.
CPC ... *B81B 2207/095* (2013.01); *B81B 2207/096* (2013.01); *H01L 21/6835* (2013.01); *H01L 23/13* (2013.01); *H01L 23/49838* (2013.01); *H01L 24/11* (2013.01); *H01L 24/13* (2013.01); *H01L 24/16* (2013.01); *H01L 24/81* (2013.01); *H01L 24/85* (2013.01); *H01L 24/94* (2013.01); *H01L 24/97* (2013.01); *H01L 29/0657* (2013.01); *H01L 2221/6834* (2013.01); *H01L 2221/68327* (2013.01); *H01L 2224/0235* (2013.01); *H01L 2224/0239* (2013.01); *H01L 2224/02313* (2013.01); *H01L 2224/02371* (2013.01); *H01L 2224/02375* (2013.01); *H01L 2224/02379* (2013.01); *H01L 2224/02381* (2013.01); *H01L 2224/04042* (2013.01); *H01L 2224/05548* (2013.01); *H01L 2224/05553* (2013.01); *H01L 2224/05554* (2013.01); *H01L 2224/05555* (2013.01); *H01L 2224/05569* (2013.01); *H01L 2224/05611* (2013.01); *H01L 2224/05624* (2013.01); *H01L 2224/05644* (2013.01); *H01L 2224/05647* (2013.01); *H01L 2224/05655* (2013.01); *H01L 2224/05669* (2013.01); *H01L 2224/0603* (2013.01); *H01L 2224/06051* (2013.01); *H01L 2224/06151* (2013.01); *H01L 2224/06155* (2013.01); *H01L 2224/06165* (2013.01); *H01L 2224/1132* (2013.01); *H01L 2224/1146* (2013.01); *H01L 2224/11849* (2013.01); *H01L 2224/131* (2013.01); *H01L 2224/13024* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/16148* (2013.01); *H01L 2224/16227* (2013.01); *H01L 2224/16238* (2013.01); *H01L 2224/4801* (2013.01); *H01L 2224/48091* (2013.01); *H01L 2224/48145* (2013.01); *H01L 2224/48227* (2013.01); *H01L 2224/81411* (2013.01); *H01L 2224/81424* (2013.01); *H01L 2224/81444* (2013.01); *H01L 2224/81447* (2013.01); *H01L 2224/81455* (2013.01); *H01L 2224/81469* (2013.01); *H01L 2224/94* (2013.01); *H01L 2224/97* (2013.01); *H01L 2225/06506* (2013.01); *H01L 2225/06513* (2013.01); *H01L 2225/06541* (2013.01); *H01L 2225/06555* (2013.01); *H01L 2924/00014* (2013.01); *H01L 2924/10155* (2013.01); *H01L 2924/10156* (2013.01); *H01L 2924/10157* (2013.01); *H01L 2924/19107* (2013.01)

(56) References Cited

U.S. PATENT DOCUMENTS

| | | | | |
|---|---|---|---|---|
| 8,736,080 | B2* | 5/2014 | Arnold | H01L 24/11 257/674 |
| 8,963,312 | B2* | 2/2015 | Ho | H01L 24/49 257/686 |
| 8,975,755 | B2* | 3/2015 | Ho | H01L 23/481 257/686 |
| 9,147,670 | B2* | 9/2015 | Chang | H01L 23/13 |
| 2009/0091042 | A1* | 4/2009 | Do | H01L 24/33 257/777 |
| 2010/0295077 | A1* | 11/2010 | Melman | H01L 33/50 257/98 |
| 2010/0295078 | A1* | 11/2010 | Chen | H01L 33/50 257/98 |
| 2013/0221542 | A1* | 8/2013 | Chang | H01L 23/13 257/777 |
| 2014/0332908 | A1* | 11/2014 | Ho | H01L 21/76877 257/414 |
| 2014/0332983 | A1* | 11/2014 | Ho | H01L 24/49 257/777 |
| 2015/0228557 | A1* | 8/2015 | Cheng | H01L 23/481 257/622 |
| 2015/0279808 | A1* | 10/2015 | Shen | H01L 21/30604 257/773 |
| 2016/0020191 | A1* | 1/2016 | Chang | H01L 24/97 438/113 |

* cited by examiner

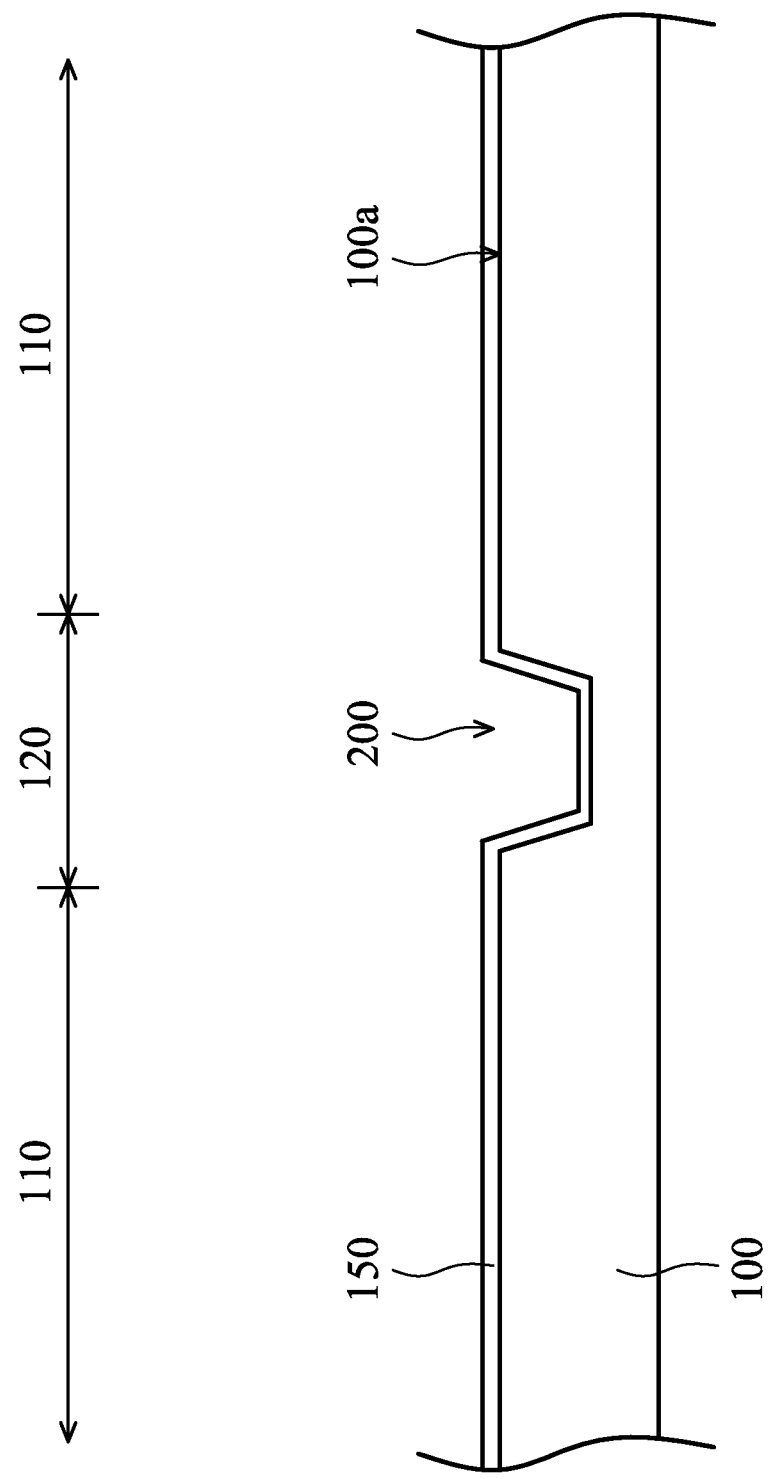

STACKED CHIP PACKAGE INCLUDING SUBSTRATE WITH RECESS ADJOINING SIDE EDGE OF SUBSTRATE AND METHOD FOR FORMING THE SAME

CROSS REFERENCE TO RELATED APPLICATIONS

The application is based on, and claims priority of Taiwan Patent Application No. 103115137, filed on Apr. 28, 2014, the entirety of which is incorporated by reference herein.

BACKGROUND OF THE INVENTION

Field of the Invention

The invention relates to chip packaging technology, and in particular to stacked chip packages and methods for forming the same.

Description of the Related Art

In general, after a chip package is formed, the chip package is bonded onto a packaging component, such as an interposer or a printed circuit board (PCB). External conducting structures are formed between the chip package and the packaging component. Conducting pads in the chip package are electrically connected to circuits on the packaging component through the external conducting structures, such that a stacked chip package is formed.

However, the external conducting structures increase the entire size of the stacked chip package. As a result, it is difficult to further decrease the size of stacked chip packages made therefrom.

Thus, there exists a need in the art for development of a stacked chip package and methods for forming the same capable of mitigating or eliminating the aforementioned problems.

BRIEF SUMMARY OF THE INVENTION

An embodiment of the invention provides a stacked chip package comprising at least one first substrate. The first substrate has a first side and a second side opposite thereto. A recess is located in the first substrate and adjoins a side edge of the first substrate. A plurality of redistribution layers is disposed on the first substrate and extends onto a bottom of the recess. At least one second substrate is disposed on the first side of the first substrate. A plurality of bonding wires is correspondingly disposed on the plurality of redistribution layers in the recess, and extends onto the second substrate. At least one device substrate is disposed on the second side of the first substrate.

An embodiment of the invention provides a method for forming a stacked chip package comprising providing at least one first substrate having a first side and a second side opposite thereto. A recess is located in the first substrate and adjoins a side edge of the first substrate. A plurality of redistribution layers is disposed on the first substrate and extends onto a bottom of the recess. At least one second substrate is provided on the first side of the first substrate. A plurality of bonding wires is formed correspondingly on the plurality of redistribution layers in the recess and extends onto the second substrate. At least one device substrate is provided on the second side of the first substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 1A to 1C are cross-sectional views of an exemplary embodiment of a method for forming a first substrate of a stacked chip package according to the invention.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive elements or electronic components of integrated circuits, such as digital or analog circuits. For example, the chip package may be related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level packaging (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The aforementioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the aforementioned wafer-level packaging process may also be adapted to form a chip package having multilayer integrated circuit devices by stacking a plurality of wafers having integrated circuits.

Figure 8:
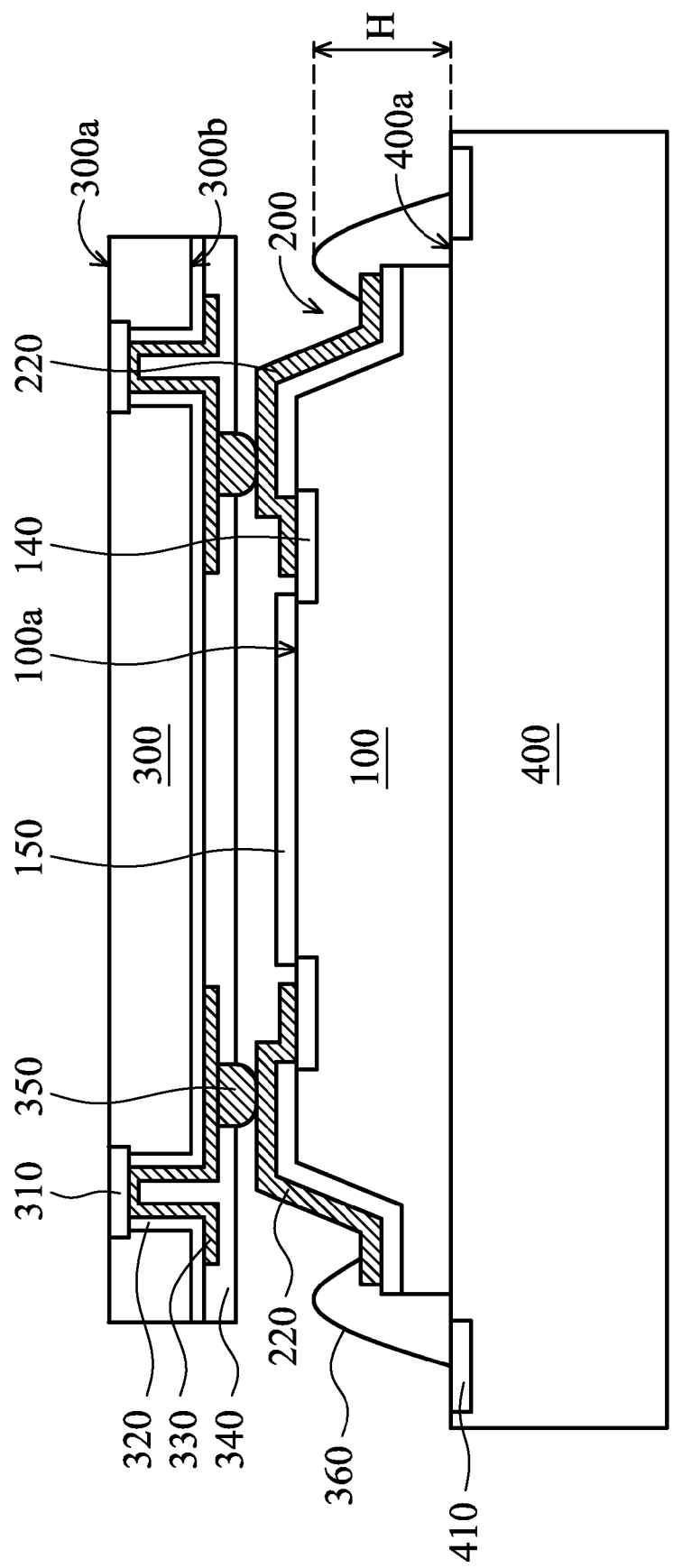
FIG. 8 is a cross-sectional view of an exemplary embodiment of a stacked chip package according to the invention.

Referring to FIG. 8, a cross-sectional view of an exemplary embodiment of a stacked chip package according to the invention is illustrated. In the embodiment, the stacked chip package comprises a first substrate 100, a second substrate 400, a device substrate 300 and a plurality of bonding wires 360. The first substrate 100 has a first side and a second side opposite to the first side. The first substrate 100 comprises a plurality of third conducting pads 140 adjacent to an upper surface 100a of the first substrate 100. In the embodiment, the first substrate 100 may be a chip or an interposer. In one embodiment, the first substrate 100 is a silicon wafer so as to facilitate the wafer-level packaging process. In the embodiment, the third conducting pad 140 may be a single conducting layer or comprise multiple conducting layers. Only a single conducting layer is depicted herein as an example.

Figure 7:
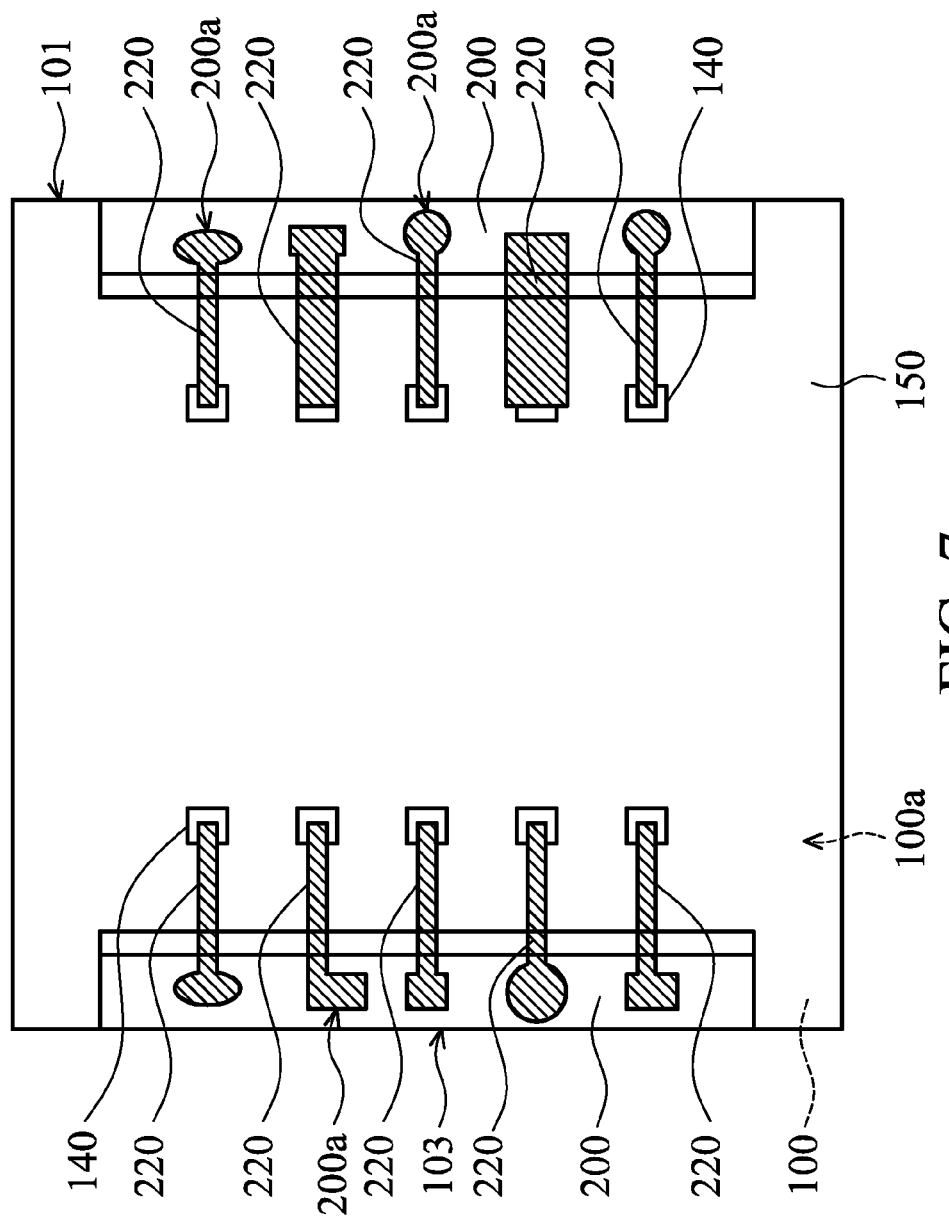

Referring to FIGS. 7 and 8, wherein FIG. 7 is a top-view of an exemplary embodiment of a first substrate 100 of a stacked chip package according to the invention. In this embodiment, the first substrate 100 comprises two recesses 200. One recess 200 adjoins a side edge 101 of the first substrate 100, and the other recess 200 adjoins a side edge 103 of the first substrate 100 opposite to the side edge 101. Furthermore, the sidewalls of the recesses 200 are inclined to the upper surface 100a of the first substrate 100, and the bottoms of the recesses 200 are parallel to the upper surface 100a of the first substrate 100. In another embodiment, the sidewalls of the recesses 200 are inclined to the upper surface 100a of the first substrate 100, and the bottoms of the recesses 200 are non-parallel to the upper surface 100a of the first substrate 100. In other embodiments, the sidewalls of the recesses 200 are perpendicular to the upper surface 100a of the first substrate 100, and the bottoms of the recesses 200 may be parallel or non-parallel to the upper surface 100a of the first substrate 100. In addition, the sidewall and the bottom of the recess 220 may be rough and uneven, and have a jagged contour. In the embodiment of FIGS. 7 and 8, the recesses 200 adjoining the side edges 101 and 103 of the first substrate 100 are single-step recess. However, in other embodiments, the first substrate 100 may comprise a multi-step recess formed of a plurality of continuous recesses (not shown).

A passivation layer 150 is disposed on the upper surface 100a of the first substrate 100 and extends to the sidewalls and the bottoms of the recesses 200. The passivation layer 150 comprises a plurality of openings to expose the third conducting pads 140 correspondingly. In the embodiment, the passivation layer 150 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable dielectric material.

A plurality of redistribution layers (RDL) 220 is disposed on the passivation layer 150 and contacts the exposed third conducting pads 140. The redistribution layers 220 extend to the sidewalls and the bottoms of the recesses 200. In one embodiment, the redistribution layers 220 partially cover the exposed third conducting pads 140. In another embodiment, the redistribution layers 220 may completely cover the exposed third conducting pads 140. In the embodiment, the redistribution layers 220 may comprise copper, aluminum, gold, platinum, nickel, tin, a combination thereof or another suitable conductive material.

In the embodiment of FIG. 7, the redistribution layers 220 comprise an end extending to the bottom of recess 200, and the ends have an expanded portion 220a. The expanded portions 220a have the same size and/or shape or have different sizes and/or shapes. For example, two circular expanded portions 220a in the same recess 200 adjoining the side edge 101 have the same size, while one circular expanded portion 220a in the recess 200 adjoining the side edge 101 has a size that is different from that of another circular expanded portion 220a in the recess 200 adjoining the side edge 103. Furthermore, the expanded portions 220a in the recesses 200 adjoining the side edge 101 and the expanded portions 220a in the recesses 200 adjoining the side edge 103 individually have circular, oval and rectangular shapes. In other embodiments, the expanded portions 220a of the redistribution layers 220 may have other shapes and sizes which are suitable for use as circuit patterns. In addition, it should be realized that the position of the third conducting pads 140, the number and extending path of the redistribution layers 220, and the size and shape of the expanded portions 220a shown in figures are illustrated as an example and they are not limited thereto.

Referring to FIG. 8 again, a second substrate 400 is disposed on the first side of the first substrate 100. In the embodiment, the second substrate 400 may be a chip, an interposer or a circuit board. The second substrate 400 may comprise a plurality of fourth conducting pads 410 adjacent to an upper surface 400a of the second substrate 400. In the embodiment, the fourth conducting pads 410 may be a single conducting layer or comprise multiple conducting layers. Only a single conducting layer is depicted herein as an example.

A plurality of bonding wires 360 is disposed on the corresponding redistribution layers 220 in the recesses 200 of the first substrate 100 and extends onto the fourth conducting pads 400 on the second substrate 410, such that the redistribution layers 220 are electrically connected to the corresponding fourth conducting pads 410. In the embodiment, the bonding wires 360 are located between the upper surface 100a of the first substrate 100 and the upper surface 400a of the second substrate 400. The maximum height H of the bonding wires 360 is lower than the upper surface 100a of the first substrate 100.

A device substrate 300 is disposed on the second side of the first substrate 100 to form a three-dimensional stacked chip package. In the embodiment, the device substrate 300 may be a chip and may have a sensing element (not shown) on an upper surface 300a of the device substrate 300. In one embodiment, the sensing element may be a biometric-sensing element (such as a fingerprint-recognition element), an image-sensing element or another suitable sensing element. In the embodiment, the device substrate 300 comprises a plurality of first conducting pads 310 adjacent to the upper surface 300a. In the embodiment, the first conducting pads 310 may be a single conducting layer or comprise multiple conducting layers, and may be electrically connected to the sensing element (not shown) on the device substrate 300 through an interconnection structure (not shown). Only a single conducting layer is depicted herein as an example. Furthermore, the first conducting pads 310 may be electrically connected to the redistribution layers 220 on the first substrate 100 by through silicon vias (TSVs) in the device substrate 300 and a plurality of first conducting structures 350.

For example, the device substrate 300 comprises a plurality of openings extending from the lower surface 300b towards the upper surfaces 300a to expose the first conducting pads 310. An insulating layer 320 is disposed on the lower surface 300b and extends into the openings of the device substrate 300. In the embodiment, the insulating layer 320 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

A patterned conducting layer 330 is disposed on the insulating layer 320 and extends into the openings of the device substrate 300. The conducting layer 330 electrically contacts the exposed first conducting pads 310 and is electrically isolated from the device substrate 300 by the insulating layer 320. Therefore, the conducting layer 300 in the openings of the device substrate 300 forms TSVs. In the embodiment, the conducting layer 300 may comprise copper, aluminum, gold, platinum, nickel, tin, a combination thereof or another suitable conductive material.

In another embodiment, the openings in the device substrate 300 may expose the sidewalls of the first conducting pads 310. The patterned conducting layer 330 is electrically isolated from the device substrate 300 by the insulating layer 320 and directly contacts the exposed sidewalls of the first conducting pads 310. As a result, the conducting layer 330 electrically connected to the first conducting pads 310 forms T-contacts. In yet another embodiment, the openings in the device substrate 300 may penetrate through the first conducting pads 310, such that the patterned conducting layer 330 can directly contact the inner of the first conducting pads 310. As a result, the conducting layer 330 electrically connected to the first conducting pads 310 forms ring-contacts.

A passivation layer 340 is disposed on the patterned conducting layer 330 and fills into the openings of the device substrate 300 to cover the conducting layer 330. The passivation layer 340 comprises a plurality of openings exposing portions of the conducting layer 330 on the lower surface 300b of the device substrate 300. In the embodiment, the passivation layer 340 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), photoresist materials, or another suitable insulating material.

The first conducting structures 350 are disposed in the openings of the passivation layer 340. The device substrate 300 is bonded to the first substrate 100 through the first conducting structures 350. Furthermore, the first conducting structures 350 electrically contact the redistribution layers 220 on the first substrate 100. In the embodiment, the first conducting structures 350 may be solder balls, bumps, or conductive pillars, and may comprise tin, lead, copper, gold, nickel, a combination thereof, or another suitable conductive material.

The size of the device substrate 300 is greater than the size of the first substrate 100 as shown in FIG. 8, but the size of the device substrate 300 may be equal to or less than the size of the first substrate 100. Moreover, the size of the first substrate 100 may be large enough to dispose more than one device substrate 300 on the second side of the first substrate 100. Similarly, the size of the second substrate 400 may be large enough to bond more than one first substrate 100 to the second substrate 400.

Figure 9:
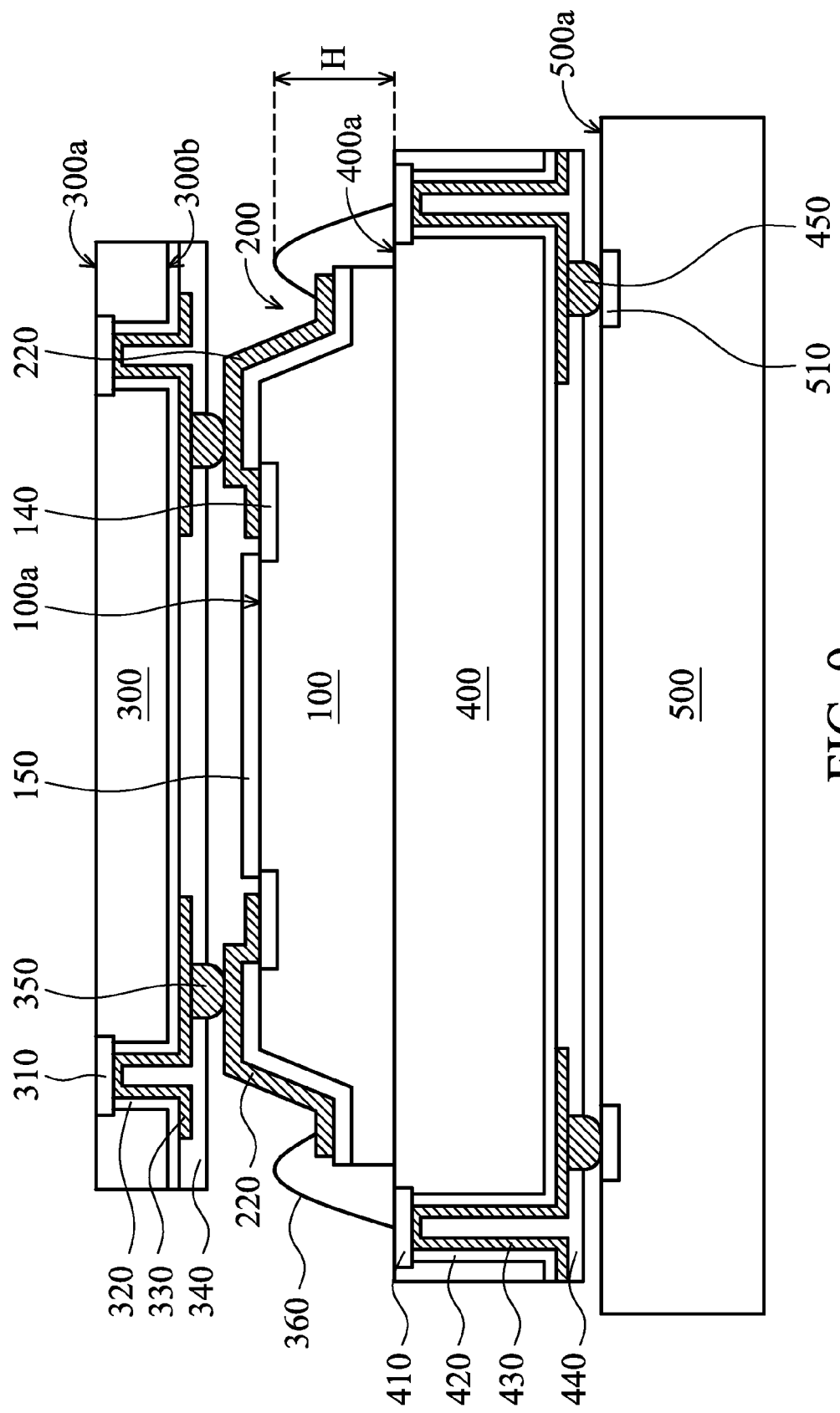
FIG. 9 is a cross-sectional view of another exemplary embodiment of a stacked chip package according to the invention.

Referring to FIG. 9, a cross-sectional view of another exemplary embodiment of a stacked chip package according to the invention is illustrated, wherein elements in FIG. 9 that are the same as those in FIGS. 7 and 8 are labeled with the same reference numbers as in FIGS. 7 and 8 and are not described again for brevity. The stacked chip package structure shown in FIG. 9 is similar to that shown in FIG. 8. The difference therebetween is that the stacked chip package structure shown in FIG. 9 further comprises a third substrate 500. The third substrate 500 is disposed on the first side of the first substrate 100, and the second substrate 400 is located between the first substrate 100 and the third substrate 500. In the embodiment, the third substrate 500 may be a chip, an interposer or a circuit board. The third substrate 500 comprises a plurality of second conducting pads 510 adjacent to an upper surface 500a of the third substrate 500. The second conducting pads 510 may be a single conducting layer or comprise multiple conducting layers. Only a single conducting layer is depicted herein as an example.

In the embodiment of FIG. 8, the first conducting pads 310 are electrically connected to the corresponding third conducting pads 140 through TSVs in the device substrate 300 and the first conducting structures 350. Similarly, in the embodiment of FIG. 9, the fourth conducting pads 410 are electrically connected to the corresponding second conducting pads 510 through a plurality of TSVs in the second substrate 400 and a plurality of second conducting structures 450 (such as solder balls, bumps or conductive pillars). Likewise, in other embodiments, the conducting layer 430 electrically connected to the fourth conducting pads 410 may form T-contacts or ring-contacts to electrically connect the second conducting structures 450 and the second conducting pads 510. In addition, when the second substrate 400 is an interposer or a circuit board, the second substrate 400 may comprise an interconnection structure (not shown), which is formed of dielectric layers, and metal contacts and vias in the dielectric layers. The fourth conducting pads 410 may be electrically connected to the second conducting pad 510 through the interconnection structure and the second conducting structures 450.

The size of the third substrate 500 is greater than the size of the second substrate 400 as shown in FIG. 9, but the size of the third substrate 500 may be equal to the size of the second substrate 400. Moreover, the size of the third substrate 500 may be large enough to bond more than one second substrate 400 to the third substrate 500.

Figure 3:
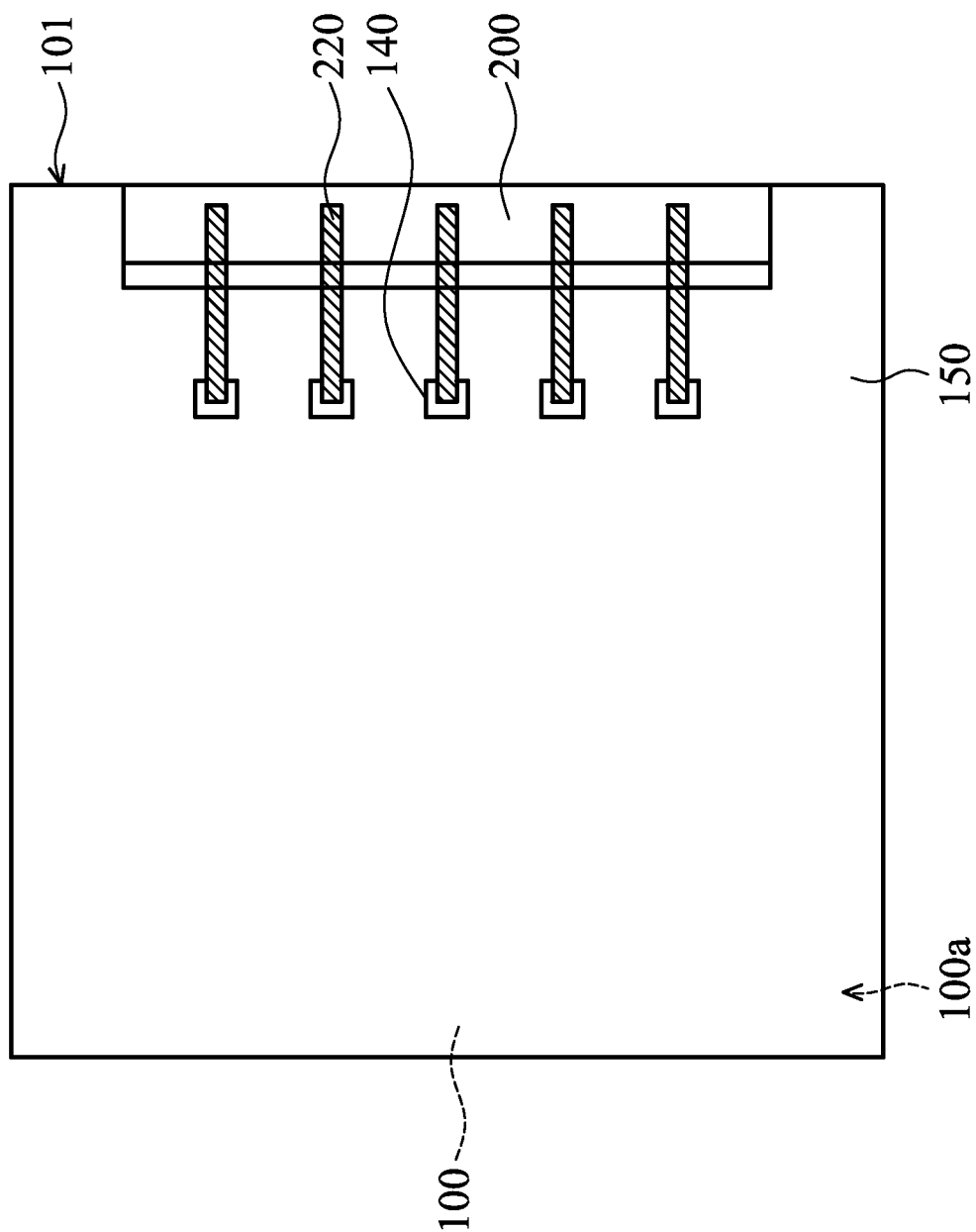
FIGS. 3 to 7 are top-views of various exemplary embodiments of a first substrate of a stacked chip package according to the invention.

Referring to FIGS. 3 to 6, top-views of various exemplary embodiments of a first substrate 100 of a stacked chip package according to the invention are illustrated, wherein elements in FIGS. 3 to 6 that are the same as those in FIGS. 7 and 8 are labeled with the same reference numbers as in FIGS. 7 and 8 and are not described again for brevity. The structure of the first substrate 100 shown in FIG. 3 is similar to that shown in FIG. 7. The difference therebetween is that the first substrate 100 shown in FIG. 3 comprises only one recess 200 adjoining the edge side 101 of the first substrate 100. Moreover, the redistribution layers 220 have the same width and length as viewed from a top view perspective, and the redistribution layers 220 do not have expanded portions (such as the expanded portions 220a shown in FIG. 7).

Figure 4:
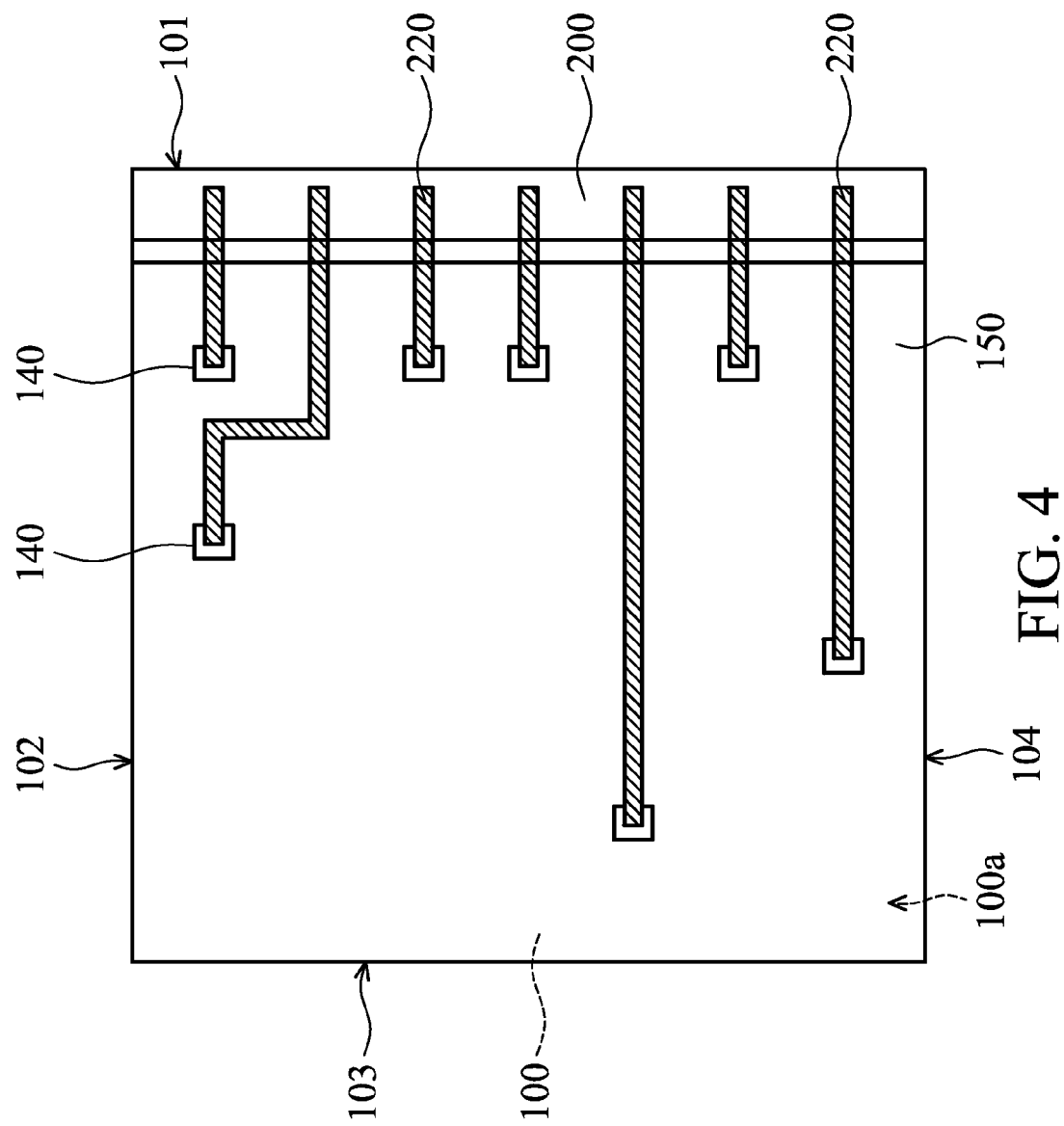

The structure of the first substrate 100 shown in FIG. 4 is similar to that shown in FIG. 3. The difference therebetween is that the recess 200 of the first substrate 100 shown in FIG. 4 crosses the entire length of the edge side 101 and extends to the corners of the first substrate 100. Furthermore, the first substrate 100 comprises third conducting pads 140 adjacent to the side edges 102, 103 and 104. The lengths of some redistribution layers 220 correspondingly electrically connected to the third conducting pads 140 adjacent to the side edges 102, 103 and 104 are greater than the lengths of other redistribution layers 220 correspondingly electrically connected to the third conducting pads 140 adjacent to the side edge 101. In addition, the extending path of the redistribution layers 220 from the third conducting pads 140 to the bottom of the recess 200 may be straight or tortuous.

In the embodiment of FIG. 4, since the recess 200 of the first substrate 100 crosses the entire length of the edge side 101 and extends to the corners of the first substrate 100, the stress can be reduced, thereby preventing the first substrate 100 from cracking. Furthermore, the redistribution layers 220, which are electrically connected to the third conducting pads 140 relatively closer to the corners of the first substrate 100, can extend directly into the recess 200. As a result, the connective path of the redistribution layers 220 can be significantly shortened, the speed of transmitting signals can be increased, and the surface area of the first substrate 100 occupied by the redistribution layers 220 can be reduced.

Figure 5:
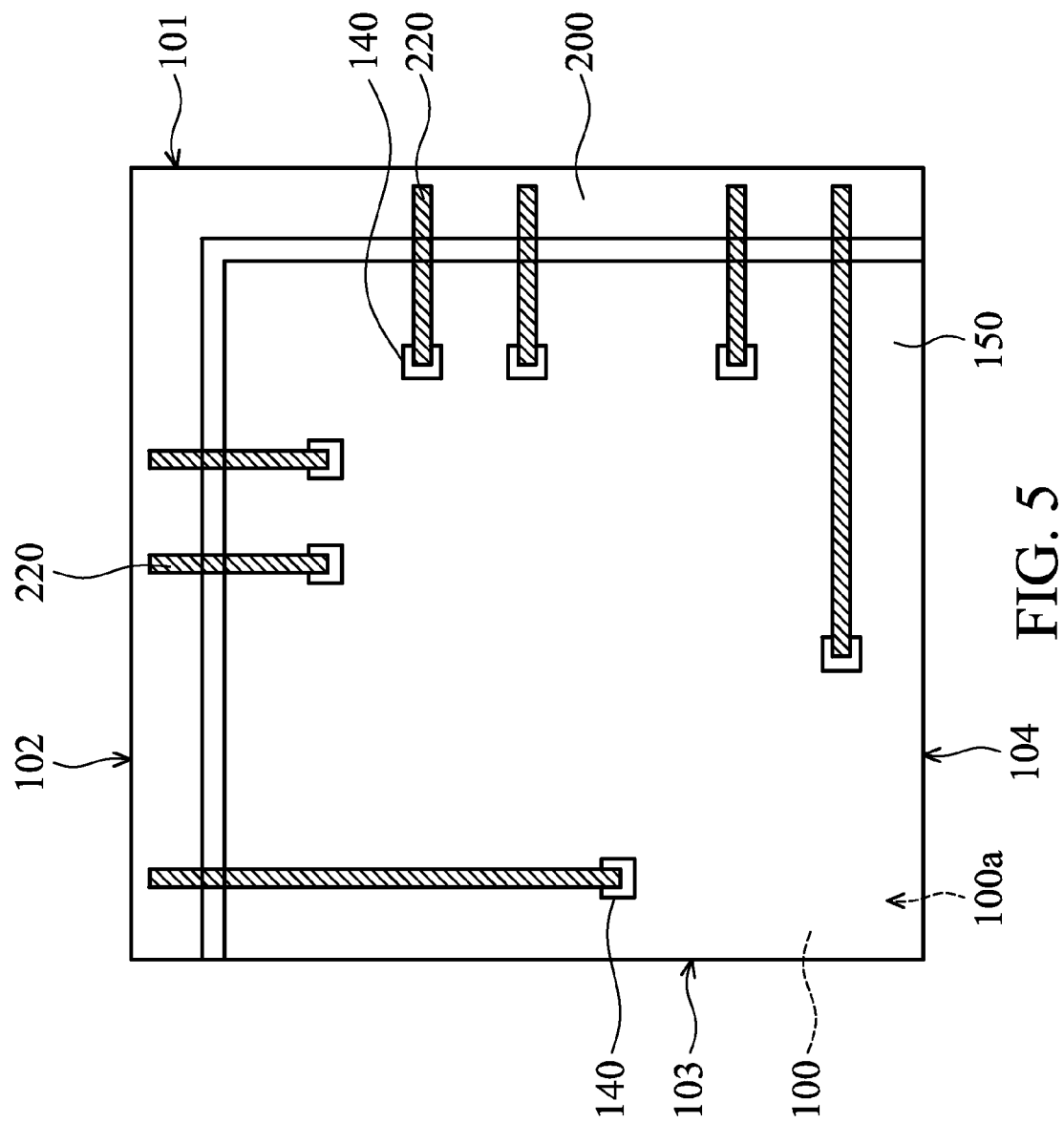

The structure of the first substrate 100 shown in FIG. 5 is similar to that shown in FIG. 4. The difference therebetween is that the recess 200 of the first substrate 100 shown in FIG. 5 crosses not only the entire length of the edge side 101 but also the entire length of the edge side 102 adjacent to the edge side 101.

Figure 6:
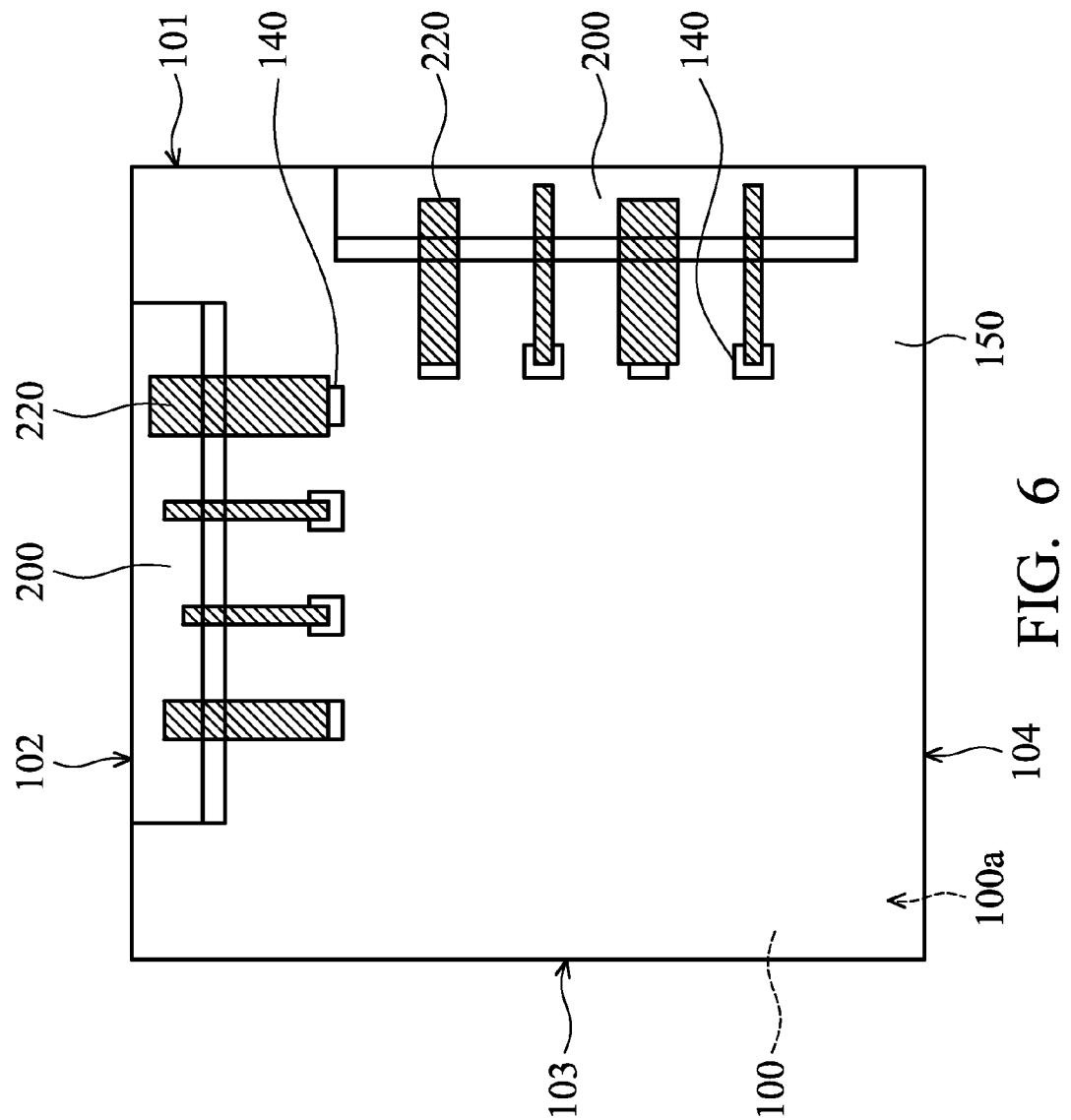

The structure of the first substrate 100 shown in FIG. 6 is similar to that shown in FIG. 3. The difference therebetween is that the first substrate 100 shown in FIG. 6 comprises one recess 200 adjoining the edge side 101 and another recess 200 adjoining the edge side 102 adjacent to the edge side 101. Moreover, the width of the redistribution layers 220 is less than the width of the third conducting pads 140, and the redistribution layers have the same length as viewed from a top view perspective shown in FIG. 3. However, in FIG. 6, the widths of the various redistribution layers 220 are less than, equal to, or greater than the width of the third conducting pads 140, and the lengths of the various redistribution layers are the same or different.

In the aforementioned embodiments, the recess 200 crosses the entire lengths of the edge sides 101 and 102 (as shown in FIG. 5) or the first substrate 100 has one recess 200 adjoining the side edge 101 and another recess 200 adjoining the side edge 102 (as shown in FIG. 6). As a result, the redistribution layers 220, which are electrically connected to the third conducting pads 140 adjacent to the side edge 102, can extend directly into the recess 200 adjoining the side edge 102. Accordingly, the connective path can be significantly shortened, the speed of transmitting signals can be increased, and the surface area of the first substrate 100 occupied by the redistribution layers 220 can be reduced. Therefore, the layout flexibility of output signals of the stacked chip package can be increased. In addition, the various embodiments of the first substrate 100 shown in FIGS. 3 to 6 can be implemented to the aforementioned various embodiments of the first substrate 100 of the stacked chip package shown in FIGS. 8 and 9.

According to the aforementioned various embodiments, the stacked chip package comprises the recess 200 in the first substrate 100 and adjoining the side edge 101 of the first substrate 100, such that the redistribution layers 220 can extend to the bottom of the recess 200. When the second substrate 400 is bonded to the second side of the first substrate 100, the redistribution layers 220 on the bottom of the recess 200 are electrically connected to the fourth conducting pads 410 on the second substrate 400 through the bonding wires 360. The bonding wires 360 are located between the upper surface 100a of the first substrate 100 and the second substrate 400 without protruding from the upper surface 100a of the first substrate 100. Therefore, the entire size of the stacked chip package is significantly decreased.

Figure 1B:
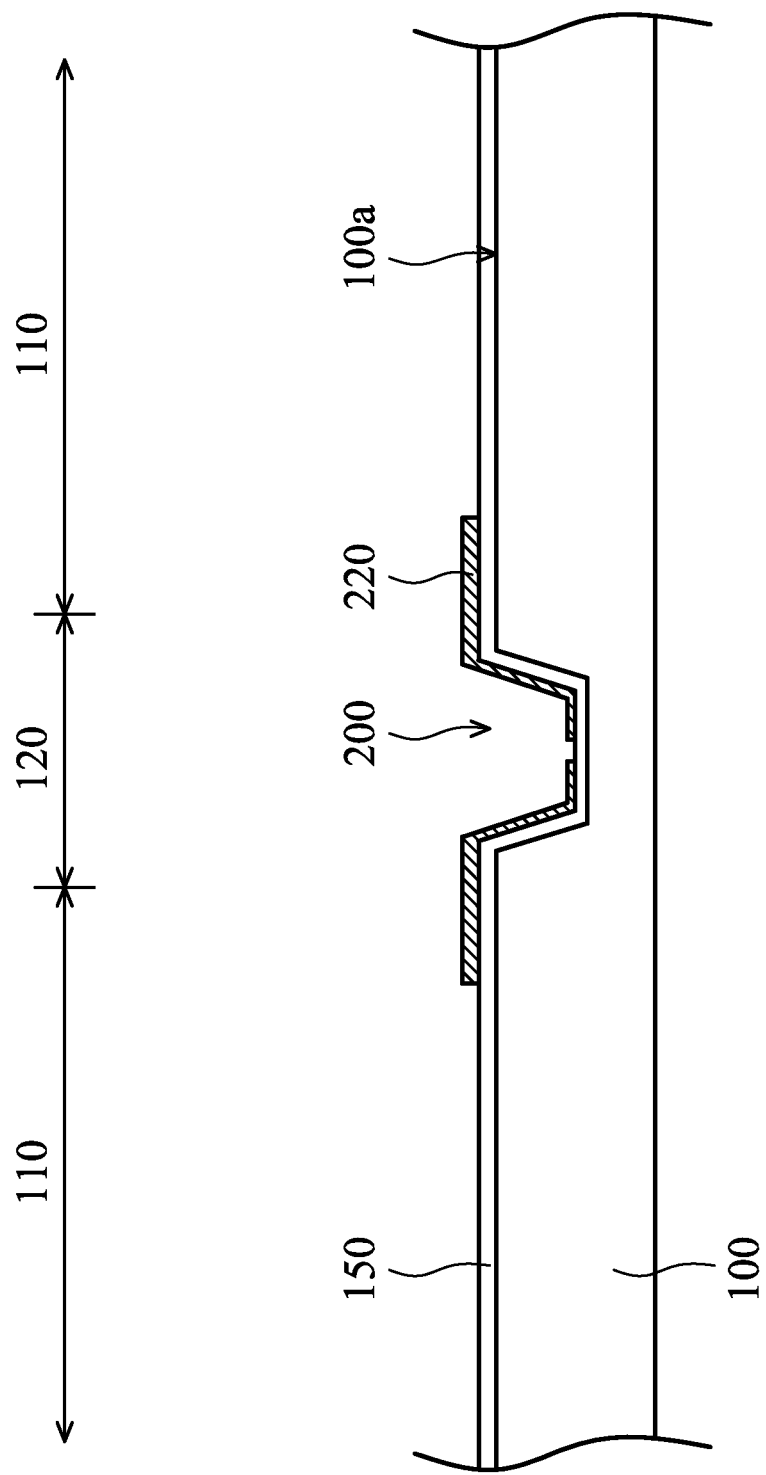
Figure 1C:
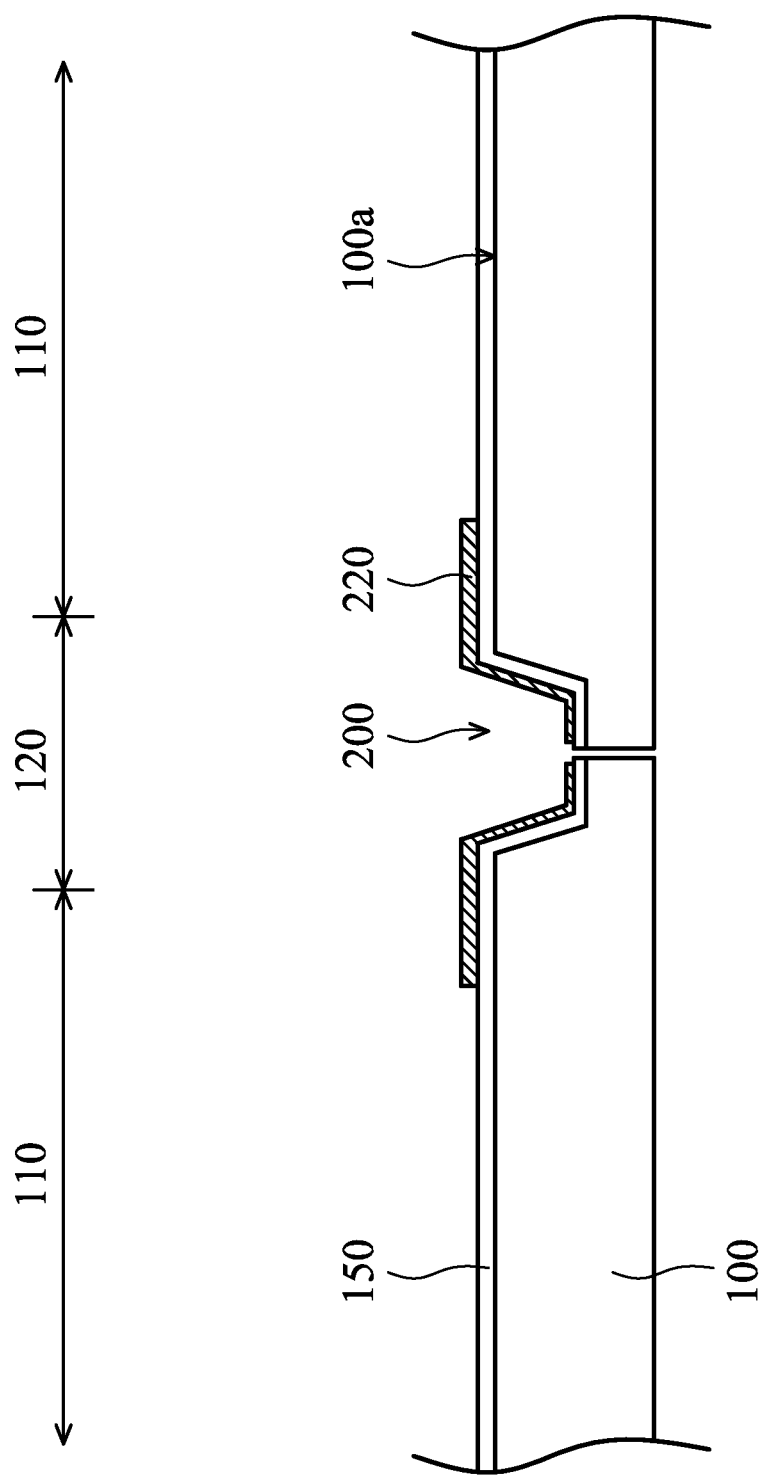

An exemplary embodiment of a method for forming a first substrate of a stacked chip package according to the invention is illustrated with FIGS. 1A to 1C, wherein FIGS. 1A to 1C are cross-sectional views of an exemplary embodiment of a method for forming a first substrate of a stacked chip package according to the invention.

Referring to FIG. 1A, a first substrate 100 is provided. The first substrate 100 has a first side (such as the bottom of the first substrate 100) and a second side (such as the top of the first substrate 100) opposite to the first side. The first substrate 100 comprises a plurality of chip regions 110 and a scribe-line region 120 separating the chip regions 110. In the embodiment, the first substrate 100 may be a chip or an interposer. In one embodiment, the first substrate 100 is a silicon wafer so as to facilitate the wafer-level packaging process.

A portion of the first substrate 100 in the scribe-line region 120 is removed by lithography and etching processes to form a recess 200 in the first substrate 100. In one embodiment, the recess 200 is positioned within the scribe-line region 120. In another embodiment, the recess 200 may extend into the chip regions 110. In one embodiment, the sidewall of the recess 200 is inclined to the upper surface 100a of the first substrate 100, and the bottom of the recess 200 is parallel to the upper surface 100a of the first substrate 100. In another embodiment, the sidewall of the recess 200 is inclined to the upper surface 100a of the first substrate 100, and the bottom of the recess 200 is non-parallel to the upper surface 100a of the first substrate 100. In other embodiments, the sidewall of the recess 200 is perpendicular to the upper surface 100a of the first substrate 100, and the bottom of the recess 200 may be parallel or non-parallel to the upper surface 100a of the first substrate 100. In addition, the sidewall and the bottom of the recess 220 may be rough and uneven, and have a jagged contour. In other embodiments, a multi-step recess formed of a plurality of continuous recesses (not shown) may be formed in the first substrate 100 by performing multiple lithography and etching processes.

Next, a passivation layer 150 is formed on the upper surface 100a of the first substrate 100 by a deposition process (such as a coating process, a physical vapor deposition process, a chemical vapor deposition process or another suitable process). The passivation layer 150 extends onto the sidewall and the bottom of the recess 200. In the embodiment, the passivation layer 150 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable dielectric material.

Referring to FIG. 1B, a plurality of redistribution layers 220 is formed on the upper surface 100a of the first substrate 100 by a deposition process (such as a coating process, a physical vapor deposition process, a chemical vapor deposition process or another suitable process) and a patterning process (such as lithography and etching processes). The redistribution layers 220 extend to the sidewall and the bottom of the recess 200. In the embodiment, the redistribution layers 220 may comprise copper, aluminum, gold, platinum, nickel, tin, a combination thereof or another suitable conductive material.

Referring to FIG. 1C, a dicing process is performed along the scribe-line region 120. The passivation layer 150 and the first substrate 100 are diced from the recess 200 to form a plurality of separated first substrate 100. In another embodiment, before performing the dicing process, a temporary substrate (not shown, such as a glass substrate or a silicon wafer) may be formed on the upper surface 100a of the first substrate 100. A thinning process (such as a mechanical grinding process or a chemical-mechanical polishing process) is then performed on the lower surface of the first substrate 100 by using the temporary substrate as a support. As a result, the thickness of the first substrate 100 is decreased so as to facilitate the subsequent dicing process.

Figure 2:
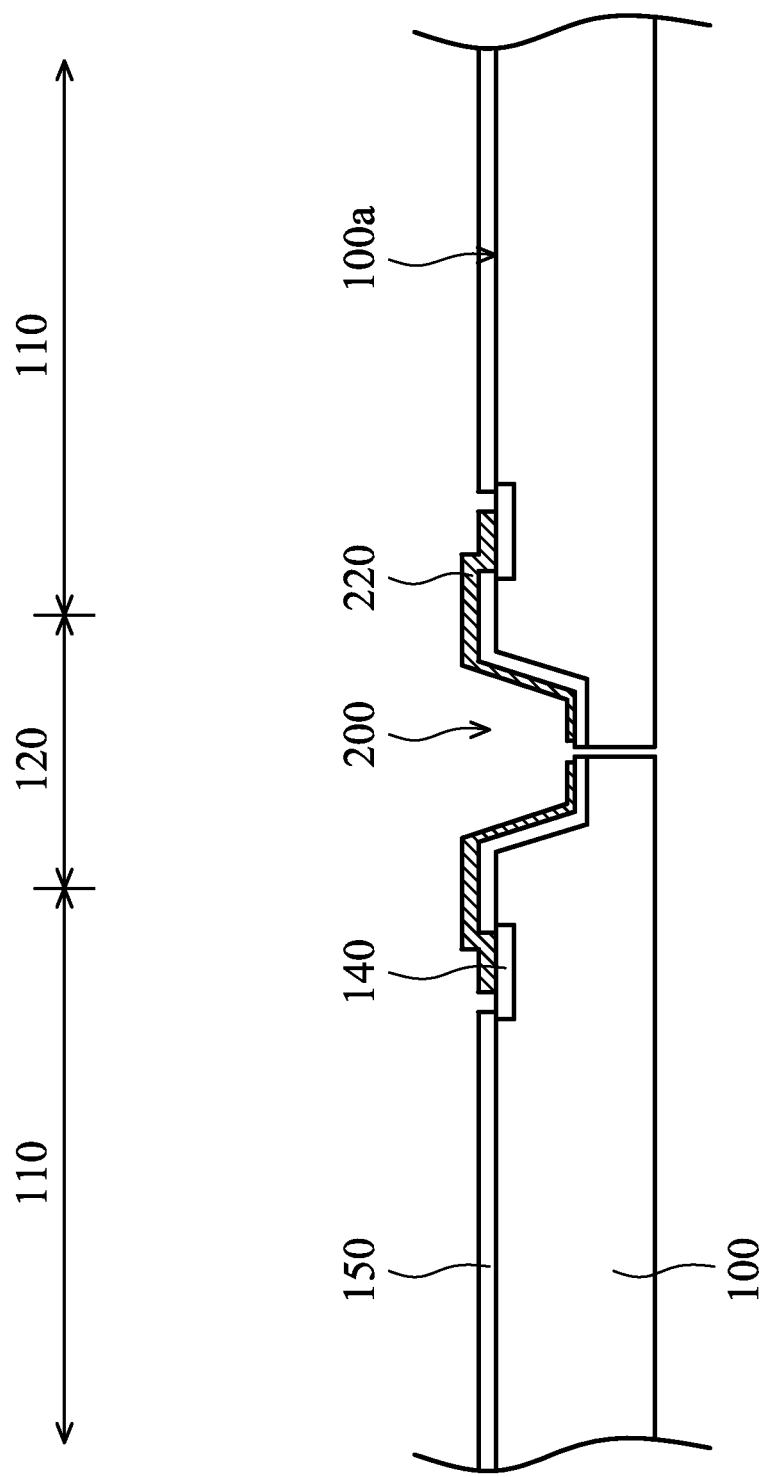
FIG. 2 is a cross-sectional view of another exemplary embodiment of a first substrate of a stacked chip package according to the invention.

An exemplary embodiment of a method for forming a stacked chip package according to the invention is illustrated with FIGS. 2 and 8, wherein FIG. 2 is a cross-sectional view of an exemplary embodiment of a first substrate comprising a conducting pad according to the invention, and FIG. 8 is a cross-sectional view of an exemplary embodiment of a stacked chip package according to the invention. Moreover, elements in FIGS. 2 and 8 that are the same as those in FIGS. 1A to 1C are labeled with the same reference numbers as in FIGS. 1A to 1C and are not described again for brevity.

The structure of the first substrate 100 shown in FIG. 2 is similar to that shown in FIG. 1C. The difference therebetween is that the first substrate 100 shown in FIG. 2 comprises a plurality of third conducting pads 140 adjacent to the upper surface 100a. In the embodiment, the third conducting pads 140 may be a single conducting layer or comprise multiple conducting layers. Furthermore, after the passivation layer 150 is formed, portions of the passivation layer 150 on the third conducting pads 140 are removed by lithography and etching processes to expose portions of the third conducting pads 140. Moreover, the redistribution layers 220 are disposed on the exposed third conducting pads 140, and partially cover the third conducting pads 140. In addition, the redistribution layers 220 may completely cover the third conducting pads 140.

Next, referring to FIG. 8, after performing a dicing process on the first substrate 100 comprising the third conducting pads 140, a second substrate 400 is provided on the first side of the first substrate 100. In the embodiment, the second substrate 400 may be a chip, an interposer or a circuit board. The second substrate 400 may comprise a plurality of fourth conducting pads 410 adjacent to the upper surface 400a of the second substrate 400. In the embodiment, the fourth conducting pads 410 may be a single conducting layer or comprise multiple conducting layers. Only a single conducting layer is depicted herein as an example.

A plurality of bonding wires 360 is then formed on the corresponding redistribution layers 220 in the recess 200 of the first substrate 100 by wire bonding process. The bonding wires 360 extend onto the fourth conducting pads 410 of the second substrate 400 so as to electrically connect the redistribution layer 220 to the corresponding fourth conducting pads 410. In the embodiment, the bonding wires 360 are located between the upper surface 100a of the first substrate 100 and the upper surface 400a of the second substrate 400. The maximum height H of the bonding wires 360 is lower than the upper surface 100a of the first substrate 100.

A device substrate 300 is provided on the second side of the first substrate 100. In the embodiment, the device substrate 300 may be a chip and may have a sensing element (not shown) on the upper surface 300a of the device substrate 300. In one embodiment, the sensing element may be a biometric-sensing element (such as a fingerprint-recognition element), an image-sensing element or another suitable sensing element. In the embodiment, the device substrate 300 comprises a plurality of first conducting pads 310 adjacent to the upper surface 300a. In the embodiment, the first conducting pads 310 may be a single conducting layer or comprise multiple conducting layers, and may be electrically connected to the sensing element (not shown) on the device substrate 300 through an interconnection structure (not shown). Only a single conducting layer is depicted herein as an example.

Furthermore, before the device substrate 300 is bonded to the first substrate 100, a plurality of openings is previously formed in the device substrate 300 by lithography and etching processes, wherein the etching process may be a dry etching process, a wet etching process, a plasma etching process, a reactive ion etching process, or another suitable process. The openings extend from the lower surface 300b of the device substrate 300 towards the upper surface 300a of the device substrate 300 to expose each first conducting pad 310 adjacent to the upper surface 300a.

Next, an insulating layer 320 is formed on the lower surface 300b of the device substrate 300 by a deposition process (such as a coating process, a physical vapor deposition process, a chemical vapor deposition process or another suitable process). The insulating layer 320 extends into the openings of the device substrate 300. In the embodiment, the insulating layer 320 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

Next, portions of the insulating layer 320 on the bottoms of the openings of the device substrate 300 are removed by lithography and etching processes so as to expose surfaces of the first conducting pads 310. A patterned conducting layer 330 is formed on the insulating layer 320 by a deposition process (such as a coating process, a chemical vapor deposition process, a physical vapor deposition process, an electroplating process, an electroless plating process or another suitable process) and lithography and etching processes. The patterned conducting layer 330 extends into the openings of the device substrate 300 to electrically contact the exposed first conducting pads 310, and is electrically isolated from the device substrate 300 by the insulating layer 320. Therefore, the conducting layer 300 in the openings of the device substrate 300 forms TSVs. In the embodiment, the conducting layer 300 may comprise copper, aluminum, gold, platinum, nickel, tin, a combination thereof or another suitable conductive material.

A passivation layer 340 is then formed on the patterned conducting layer 330 by a deposition process. The passivation layer 340 fills into the openings of the device substrate 300 to cover the conducting layer 330. A plurality of openings is formed in the passivation layer 340 by lithography and etching processes to expose portions of the conducting layer 330 on the lower surface 300b of the device substrate 300. In the embodiment, the passivation layer 340 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material. In another embodiment, the passivation layer 340 may comprise a photoresist material, and the openings may be formed in the passivation layer 340 by exposure and developing processes.

Next, a first conducting structure 350 is formed in each opening in the passivation layer 340 to directly contact the exposed conducting layer 330 and electrically connect the patterned conducting layer 330. For example, solder may be formed in the openings in the passivation layer 340 by a plating process, a screen printing process or another suitable process, and then a reflow process is performed to form the conducting structures 350. In the embodiment, the first conducting structures 350 may be solder balls, bumps, or conductive pillars, and may comprise tin, lead, copper, gold, nickel, a combination thereof, or another suitable conductive material.

Afterward, the device substrate 300 is bonded onto the first substrate 100 through the first conducting structures 350, and the first conducting structures 350 are in electrical contact with the corresponding redistribution layers 220 on the first substrate 100, as shown in FIG. 8.

In another embodiment, as shown in FIG. 9, before the second substrate 400 is bonded to the first substrate 100, openings may be formed in the second substrate 400 by a similar step for forming the openings in the device substrate 300. An insulating layer 420, a patterned conducting layer 430, a passivation layer 440, and a plurality of second conducting structures 450 are sequentially formed on the second substrate 400 by similar steps for forming the insulating layer 320, the patterned conducting layer 330, the passivation layer 340, and the first conducting structures 350 on the device substrate 300.

Next, a third substrate 500 is provided on the first side of the first substrate 100. The second substrate 400 is located between the first substrate 100 and the third substrate 500. In the embodiment, the third substrate 500 may be a chip, an interposer or a circuit board. The third substrate 500 comprises a plurality of second conducting pads 510 adjacent to the upper surface 500a of the third substrate 500. The second conducting pads 510 may be a single conducting layer or comprise multiple conducting layers. Only a single conducting layer is depicted herein as an example.

The second conducting pads 510 are electrically connected to the fourth conducting pads 410 through the second conducting structures 450 and the TSVs (i.e., the conducting layer 430) in the second substrate 400. In addition, the second conducting pads 510 may be electrically connected to the second conducting structures 450 through another conducting layer without directly contacting the second conducting structured 450. In other embodiments, when the second substrate 400 is an interposer or a circuit board, the second substrate 400 may comprise an interconnection structure (not shown), which is formed of dielectric layers, and metal contacts and vias in the dielectric layers. The second conducting pads 510 may be electrically connected to the fourth conducting pads 410 through the second conducting structures 450 and the interconnection structure.

Compared to using solder balls as conducting structures between the first and second substrates or forming bonding wires on the upper surface of the first substrate and extending onto the second substrate, in the aforementioned embodiments, the recess 200 is formed in the first substrate 100 and the redistribution layer 220 extends to the bottom of the recess 200. As a result, a sufficient space for forming the bonding wires 360 is provided between the upper surface 100a of the first substrate 100 and the second surface 400. The bonding wires 360 formed in the space do not protrude from the upper surface 100a of the first substrate 100. Therefore, the entire size of the stacked chip package is significantly reduced.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A stacked chip package, comprising:
    at least one first substrate having a first side and a second side opposite thereto, wherein the at least one first substrate comprises:
    a recess in the at least one first substrate and adjoining a side edge of the at least one first substrate; and
    a plurality of redistribution layers disposed on the at least one first substrate and extending onto a bottom of the recess, wherein at least two of the plurality of redistribution layers comprise an end extending into the recess, and the ends have an expanded portion;
    at least one second substrate disposed on the first side of the at least one first substrate;
    a plurality of bonding wires correspondingly disposed on the plurality of redistribution layers in the recess, and extending onto the at least one second substrate; and
    at least one device substrate disposed on the second side of the at least one first substrate.

2. The stacked chip package as claimed in claim 1, wherein the at least one device substrate comprises a plurality of first conducting pads therein, and the plurality of first conducting pads is electrically connected to the plurality of redistribution layers through a plurality of first conducting structures.

3. The stacked chip package as claimed in claim 1, wherein the at least one device substrate is a chip.

4. The stacked chip package as claimed in claim 1, wherein the at least one first substrate is a chip or an interposer.

5. The stacked chip package as claimed in claim 1, wherein the at least one second substrate is a chip, an interposer or a circuit board.

6. The stacked chip package as claimed in claim 1, further comprising a third substrate disposed on the first side of the at least one first substrate, wherein the at least one second substrate is located between the at least one first substrate and the third substrate.

7. The stacked chip package as claimed in claim 6, wherein the third substrate comprises a plurality of second conducting pads, and the plurality of second conducting pads is electrically connected to the bonding wires through a plurality of second conducting structures.

8. The stacked chip package as claimed in claim 6, wherein the third substrate is a chip, an interposer or a circuit board.

9. The stacked chip package as claimed in claim 1, wherein at least two of the plurality of redistribution layers have different widths and/or lengths as viewed from a top view perspective.

10. A stacked chip package, comprising:
    at least one first substrate having a first side and a second side opposite thereto, wherein the at least one first substrate comprises:

a recess in the at least one first substrate and adjoining a side edge of the at least one first substrate; and a plurality of redistribution layers disposed on the at least one first substrate and extending onto a bottom of the recess;

at least one second substrate disposed on the first side of the at least one first substrate;

a plurality of bonding wires correspondingly disposed on the plurality of redistribution layers in the recess, and extending onto the at least one second substrate; and at least one device substrate disposed on the second side of the at least one first substrate, wherein at least two of the plurality of redistribution layers comprise an end extending into the recess, and the ends have an expanded portion, and wherein the expanded portions have different sizes and/or shapes.

11. A method for forming a stacked chip package, comprising:

providing at least one first substrate having a first side and a second side opposite thereto, wherein the at least one first substrate comprises:

a recess in the at least one first substrate and adjoining a side edge of the at least one first substrate; and a plurality of redistribution layers disposed on the at least one first substrate and extending onto a bottom of the recess, wherein at least two of the plurality of redistribution layers comprise an end extending into the recess, and the ends have an expanded portion;

providing at least one second substrate on the first side of the at least one first substrate;

forming a plurality of bonding wires correspondingly on the plurality of redistribution layers in the recess and extending onto the at least one second substrate; and providing at least one device substrate on the second side of the at least one first substrate.

12. The method as claimed in claim 11, wherein the at least one device substrate comprises a plurality of first conducting pads therein, and the method further comprises forming a plurality of first conducting structures between the at least one first substrate and the at least one device substrate, such that the plurality of first conducting pads is electrically connected to the plurality of redistribution layers.

13. The method as claimed in claim 11, wherein the at least one device substrate is a chip.

14. The method as claimed in claim 11, wherein the at least one first substrate is a chip or an interposer.

15. The method as claimed in claim 11, wherein the at least one second substrate is a chip, an interposer or a circuit board.

16. The method as claimed in claim 11, further comprising providing a third substrate on the first side of the at least one first substrate, wherein the at least one second substrate is located between the at least one first substrate and the third substrate.

17. The method as claimed in claim 16, wherein the third substrate comprises a plurality of second conducting pads, and the method further comprises forming a plurality of second conducting structures between the at least one second substrate and the third substrate, such that the plurality of second conducting pads is electrically connected to the bonding wires.

18. The method as claimed in claim 16, wherein the third substrate is a chip, an interposer or a circuit board.

19. The method as claimed in claim 11, wherein at least two of the plurality of redistribution layers have different widths and/or lengths as viewed from a top view perspective.

20. The method as claimed in claim 11, wherein the expanded portions have different sizes and/or shapes.

21. The method as claimed in claim 11, wherein at least two of the plurality of redistribution layers have the same width and/or length as viewed from a top view perspective.

22. The method as claimed in claim 11, wherein the expanded portions have the same size and/or shape.

23. The stacked chip package as claimed in claim 1, wherein at least two of the plurality of redistribution layers have the same width and/or length as viewed from a top view perspective.

24. The stacked chip package as claimed in claim 1, wherein the expanded portions have the same size and/or shape.

* * * * *